US012671230B2

(12) United States Patent
Gatzmann et al.

(10) Patent No.: US 12,671,230 B2
(45) Date of Patent: Jun. 30, 2026

(54) APPARATUS FOR GENERATING LASER RADIATION WITH A LATERAL CURRENT INJECTION LASER ARRANGEMENT AND A CAVITY, AND METHOD FOR MANUFACTURING THE SAME

(71) Applicant: Fraunhofer-Gesellschaft zur Förderung der angewandten Forschung e.V., München (DE)

(72) Inventors: Jan Gregor Gatzmann, Berlin (DE); Martin Möhrle, Berlin (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 799 days.

(21) Appl. No.: 18/047,765

(22) Filed: Oct. 19, 2022

(65) Prior Publication Data
US 2023/0121108 A1     Apr. 20, 2023

(30) Foreign Application Priority Data

Oct. 20, 2021     (DE) ..................... 10 2021 211 848.8

(51) Int. Cl.
H01S 5/042          (2006.01)
H01S 5/02           (2006.01)
(Continued)

(52) U.S. Cl.
CPC .......... H01S 5/0424 (2013.01); H01S 5/0208 (2013.01); H01S 5/021 (2013.01);
(Continued)

(58) Field of Classification Search
CPC ...... H01S 5/0424; H01S 5/0208; H01S 5/021; H01S 5/04257; H01S 5/18341;
(Continued)

(56) References Cited

U.S. PATENT DOCUMENTS 5,027,364 A  *  6/1991  Thulke ................ H01S 5/04254
                                                        372/46.01
8,236,590 B2     8/2012  Matsui et al.
(Continued)

FOREIGN PATENT DOCUMENTS

JP          H07 30191 A        1/1995
JP          2015015396 A       1/2015
JP          2015220324 A      12/2015

OTHER PUBLICATIONS

European language Office Action dated 2023-03-28, issued in application No. EP 22202504.1.
(Continued)

*Primary Examiner* — Yuanda Zhang
(74) *Attorney, Agent, or Firm* — McClure, Qualey & Rodack, LLP

(57)          ABSTRACT

Embodiments of the present invention include an apparatus for generating laser radiation with a semiconductor substrate, an intermediate layer arranged on the semiconductor substrate, and a Lateral Current Injection (LCI) laser arrangement arranged on the intermediate layer, wherein the intermediate layer includes a cavity extending at least under a laser strip of the LCI laser arrangement.

9 Claims, 10 Drawing Sheets

(51) Int. Cl.
  *H01S 5/183* (2006.01)
  *H01S 5/20* (2006.01)
  *H10H 20/812* (2025.01)

(52) U.S. Cl.
  CPC ...... *H01S 5/04257* (2019.08); *H01S 5/18341* (2013.01); *H01S 5/2045* (2013.01); *H01S 5/2081* (2013.01); *H10H 20/812* (2025.01); *H01S 2301/176* (2013.01)

(58) Field of Classification Search
  CPC ................. H01S 5/2045; H01S 5/2081; H01S 2301/176; H10H 20/812
  See application file for complete search history.

(56) References Cited

U.S. PATENT DOCUMENTS

2003/0025976 A1    2/2003   Wipiejewski
2019/0369328 A1   12/2019   Davies et al.

OTHER PUBLICATIONS

Shindo, T., et al.; "Lateral-Current-Injection Distributed Feedback Laser With Surface Grating Structure;" IEEE Journal of Selected Topics in Quantum Electronics, vol. 17, No. 15; Sep./Oct. 2011; pp. 1175-1182.

Sato, T., et al.; "Photonic Crystal Lasers for Chip-to-Chip and On-Chip Optical Interconnects;" IEEE Journal of Selected Topics in Quantum Electronics, vol. 21, No. 6; Nov./Dec. 2015; pp. 1-10.

Aihara, T., et al.; "Membrane III-V/Si DFB Laser Using Uniform Grating and Width-Modulated Si Waveguide;" Journal of Light-wave Technology, IEEE, USA, vol. 38, No. 11; Jun. 2020; pp. 2961-2967.

Naitoh, H., et al.; "80° C. CW Operation of GalnAsP/InP Membrane BH-DFB Laser with Air-Bridge Structure;" Indium Phosphide &Related Materials, 2007, IEEE 19th International Conference On Phosphide and Related Materials; May 2007; pp. 476-479.

Y. Shen, N. C. Harris, S. Skirlo, M. Prabhu, T. Baehr-Jones, M. Hochberg, X. Sun, S. Zhao, H. Larochelle, D. Englund und others, „Deep learning with coherent nanophotonic circuits, Nature Photonics, Bd. 11, p. 441, 2017.

L. De Marinis, M. Cococcioni, P. Castoldi und N. Andriolli, „Photonic neural networks: a survey, IEEE Access, Bd. 7, pp. 175827-175841, 2019.

T. Hiratani, K. Doi, Y. Atsuji, T. Amemiya, N. Nishiyama und S. Arai, „Low-power and high-speed operation capabilities of semiconductor membrane lasers—Energy cost limited by Joule heat, in 26th International Conference on Indium Phosphide and Related Materials (IPRM), 2014.

S. Matsuo, T. Fujii, K. Hasebe, K. Takeda, T. Sato und T. Kakitsuka, „Ultralow operating energy of directly modulated DFB laser on SiO 2/Si substrate, in Optical Communication (ECOC), 2014 European Conference on, 2014.

N.-P. P. Diamantopoulos, S. Yamaoka, T. Fujii, H. Nishi, K. Takeda, T. Tsuchizawa, T. Kakitsuka und S. Matsuo, „47.5 GHz Membrane-III-V-on-Si Directly Modulated Laser for Sub-pJ/bit 100-Gbps Transmission, in Photonics, 2021.

D. Inoue, T. Hiratani, K. Fukuda, T. Tomiyasu, T. Amemiya, N. Nishiyama und S. Arai, „Low-bias current 10 Gbit/s direct modulation of GalnAsP/InP membrane DFB laser on silicon, Optics express, Bd. 24, pp. 18571-18579, 2016.

W. Hofmann, E. Wong, G. Bohm, M. Ortsiefer, N. H. Zhu und M. C. Amann, „1.55-mu m VCSEL Arrays for High-Bandwidth WDM-PONs, IEEE Photonics Technology Letters, Bd. 20, pp. 291-293, 2008.

N.-P. Diamantopoulos, H. Yamazaki, S. Yamaoka, M. Nagatani, H. Nishi, H. Tanobe, R. Nakao, T. Fujii, K. Takeda, T. Kakitsuka und others, „ 100-GHz Bandwidth Directly-Modulated Lasers and Adaptive Entropy Loading for Energy-Efficient> 300-Gbps/λ IM/DD Systems, Journal of Lightwave Technology, Bd. 39, pp. 771-778, 2021.

* cited by examiner

600

(a) generating an intermediate layer on a semiconductor substrate; ⌐∼610

(b) generating a Lateral Current Injection (LCI) laser arrangement on the intermediate layer; and ∼620

(c) generating a cavity in the intermediate layer, wherein the cavity at least extends at least under a laser strip of the LCI laser arrangement. ∼630

(1)

410

320

310

(2)

710

410

320

310

(3)

710

410

320

310

710

410

320

310

(4)

330

410

320

310

Fig. 7 (Part 1)

(5)
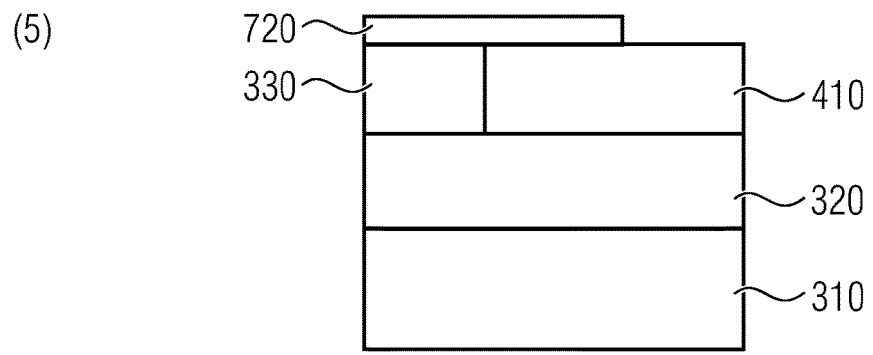
(6)
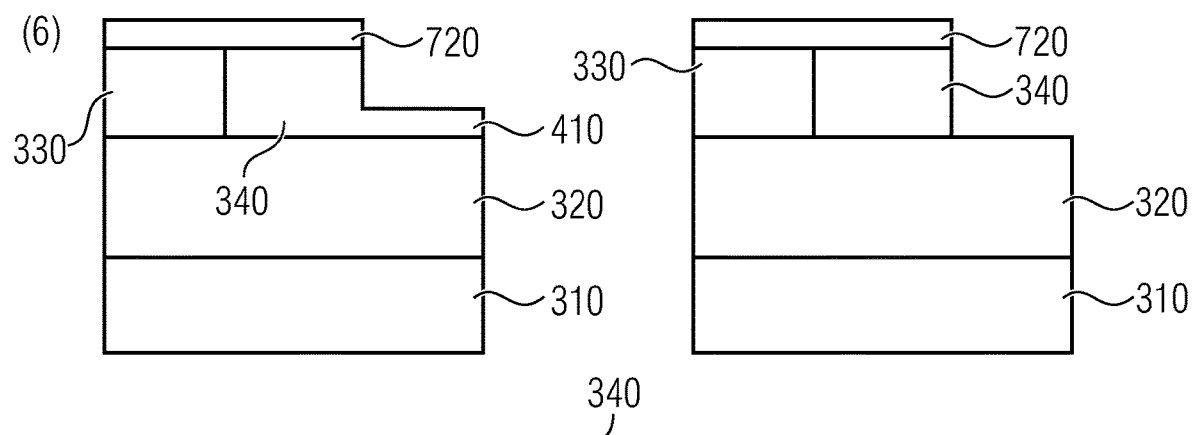
(7)
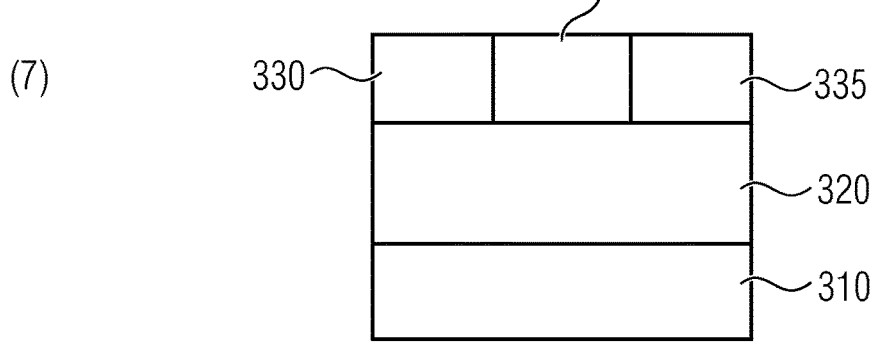
(8)
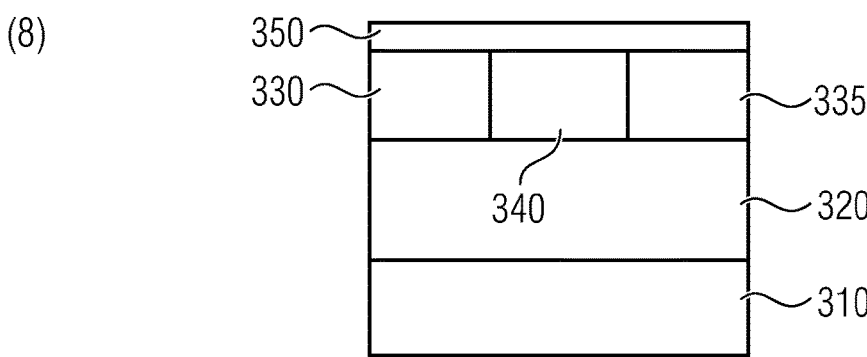
Fig. 7 (Part 2)

(9)
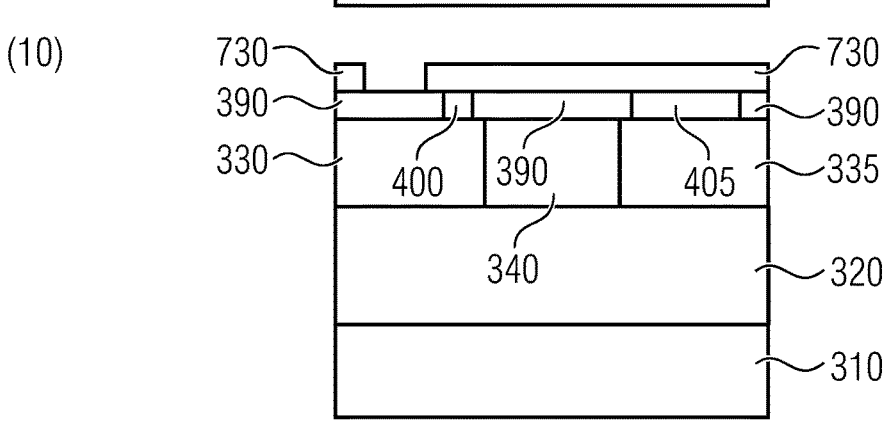
(10)
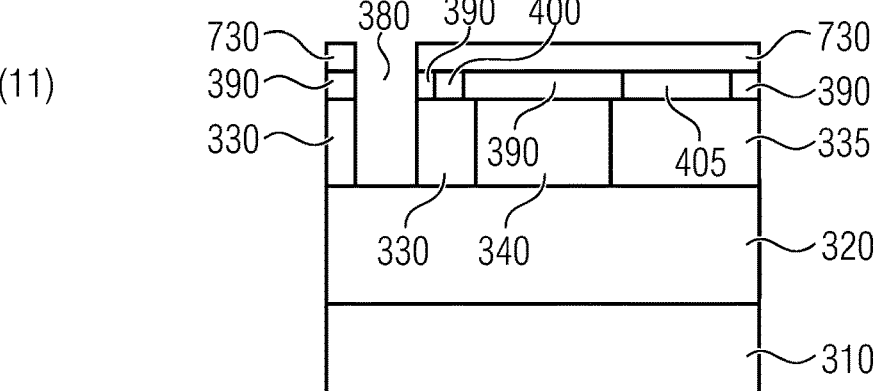
(11)
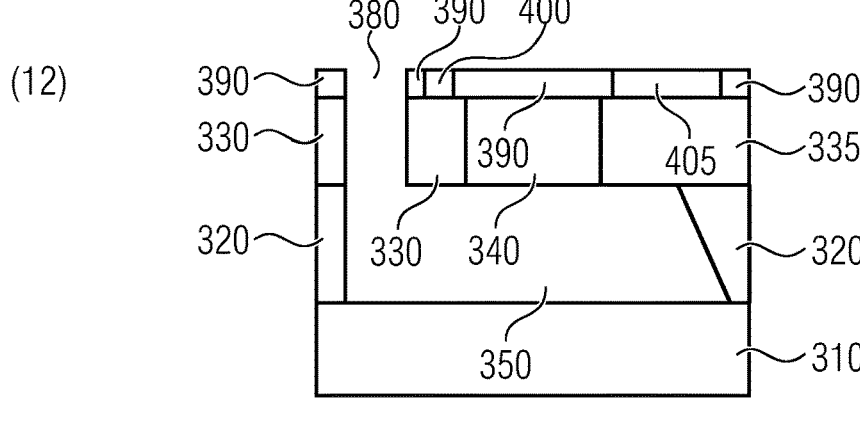
(12)
Fig. 7 (Part 3)

APPARATUS FOR GENERATING LASER RADIATION WITH A LATERAL CURRENT INJECTION LASER ARRANGEMENT AND A CAVITY, AND METHOD FOR MANUFACTURING THE SAME

CROSS-REFERENCE TO RELATED APPLICATION

This application claims priority from German Patent Application No. DE 10 2021 211 848.8, which was filed on Oct. 20, 2021, and is incorporated herein in its entirety by reference.

Embodiments according to the present invention include an apparatus for generating laser radiation with a Lateral Current Injection laser arrangement and a cavity, as well as a method for manufacturing the same.

Further embodiments according to the present invention include a method for manufacturing a membrane laser with lateral injection on an indium phosphide (InP) substrate.

BACKGROUND OF THE INVENTION

Modern applications such as optical neural networks need novel laser concepts with respect to power consumption and modulation bandwidth.

It is only in recent years that there have been successful approaches to transfer into the field of photonics these circuits that until now have been realized electronically. [1] Such photonic integrated circuits (PICs) for "Neuromorphic Photonics" belong to the key technologies of energy efficient and fast information processing with the highest requirements as to parallelism and latency. [2] These PICs are fed with optical signals by a great number of semiconductor lasers directly coupled on the smallest surface area. The high packaging density and the very short transmission paths result in entirely new requirements for the semiconductor lasers: heat development and optical output power have to be reduced approximately by one order of magnitude, while high modulation speed has to be achieved at the same time, which can only be achieved by miniaturizing the lasers accordingly. However, due to physical limitations, this is in principle not possible with the commercially available semiconductor lasers.

NTT and the Tokyo Institute of Technology have shown since 2014 that Lateral Current Injection (LCI) membrane lasers are in principle well equipped for such applications. [3] [4]

A serious disadvantage of the published LCI laser chips is the elaborate manufacturing process, which is associated with additional difficulties compared to the classical BH structure. Here, above all, the selective epitaxial lateral growing of p-doped and n-doped InP areas as well as the manufacturing of the membrane structure should be mentioned.

However, the by far largest deficiency of the previously shown LCI variations with a membrane structure is the lack of possibilities to monolithically integrate these components with other optical components on an InP substrate.

In case of the known manufacturing methods for realizing such membrane structure lasers, the entire InP wafer is bonded to wafers with a smaller refractive index such as silicon nitride or silicon oxide, and the entire InP substrate is subsequently removed starting from the rear side by thinning/etching. FIG. 1 schematically shows how the LCI membrane lasers realized to date are fundamentally built.

FIG. 1 shows a schematic side view of a LCI structure bonded onto a low-refractive material. FIG. 1 shows a LCI membrane laser 100 with a substrate 110, wherein the substrate includes silicon nitride (SiN) or silicon oxide (SiO$_2$), for example, and may additionally include a benzo-cyclobutene (BCB) layer. A Lateral Current Injection (LCI) laser arrangement including a first p-doped area 120 made of indium phosphide (p-InP) and a second n-doped-area 125 made of indium phosphide (n-InP) is arranged on the substrate 110. The laser strip 130 of the LCI laser arrangement is arranged between the two doped areas. The laser strip 130 includes a multi-quantum well (MWQ) 140, waveguides 150, and areas 160 made of indium phosphide. A passivation laser 180 and contactings 180, 185 for the respective doped areas are arranged on the LCI laser arrangement.

With respect to the structure of LCI membrane lasers shown in FIG. 1 and the above described problems, there is a need for a better concept for such lasers.

SUMMARY

According to an embodiment, an apparatus for generating laser radiation may have: a semiconductor substrate, an intermediate layer arranged on the semiconductor substrate; and a Lateral Current Injection (LCI) laser arrangement arranged on the intermediate layer, wherein the intermediate layer comprises a cavity extending at least under a laser strip of the LCI laser arrangement.

According to another embodiment, a method for manufacturing an apparatus for generating laser radiation may have the steps of: (a) generating an intermediate layer on a semiconductor substrate; (b) generating a Lateral Current Injection (LCI) laser arrangement on the intermediate layer; and (c) generating a cavity in the intermediate layer, wherein the cavity extends at least under a laser strip of the LCI laser arrangement.

Embodiments according to the present invention include an apparatus for generating laser radiation with a semiconductor substrate, an intermediate layer arranged on the semiconductor substrate, and a Lateral Current Injection (LCI) laser arrangement, for example of a membrane laser, arranged on the intermediate layer, wherein the intermediate layer includes a cavity that extends at least under a laser strip of the LCI laser arrangement.

Embodiments of the present invention are based on the idea to provide a cavity or a cavity structure, e.g. a hollow space, at least under a laser strip of the LCI laser arrangement, or adjacent to the laser strip of the LCI laser arrangement, so that the cavity enables an optical confinement, or limitation, of the generated laser radiation. This cavity is provided in an intermediate layer underneath the LCI laser arrangement, wherein said intermediate layer may form a sacrificial layer for an etching process for manufacturing the cavity.

Thus, an additional degree of freedom may be created with respect to the substrate. For example, a substrate that is advantageous for a certain field of application or with respect to an advantageous integration with other components may be used, e.g., so that there are no significant restrictions in the selection of the substrate with respect to the "optical confinement", or in other words, with respect to the properties of the substrate in terms of an optical confinement (or limitation) of the generated laser radiation. Thus, for example, a corresponding LCI laser arrangement may be monolithically integrated with other components on an InP substrate. In other words, an inventive floating laser structure may be manufactured directly on an InP substrate.

In this case, a monolithic integration enables the reduction of the manufacturing costs of components that include an inventive apparatus for generating laser radiation. Thus, for example, laser concepts for photonic integrated circuits (PIC) may be provided in a cost efficient way and with low technical effort.

The optical confinement of generated laser radiation may be further improved by the cavity so that the laser radiation faces is subject to lower losses, and the efficiency may be increased through the improvement of the optical confinement in the active layer.

In addition, e.g. due to the decreased energy demand, a multitude of inventive apparatuses for generating laser radiation may be used in arrangements with a high packing density and for applications with very short transmission paths. For example, an arrangement of inventive apparatuses may feed PICs or may be part of a PIC, wherein the inventive apparatuses may be monolithically integrated with further components on a common substrate. For example, the substrate may be semi-insulating InP.

Thus, it becomes clear that an inventive apparatus enables a better tradeoff between the complexity of the structure, the efficiency of the apparatus, the possibilities and effort of the integration with further optical components, and the manufacturing costs.

According to embodiments of the present invention, the cavity is configured to optically confine the laser radiation in the laser strip of the LCI laser arrangement. This may decrease the energy consumption of an inventive laser.

According to embodiments of the present invention, the LCI laser arrangement includes a first area with a first doping, e.g. including p-doped InP, and a second area with a second doping, e.g. including n-doped InP, wherein the first and second doping are different, and wherein the laser strip of the LCI laser arrangement is arranged laterally between the first area and the second area of the LCI laser arrangement. In this case, the laser strip is configured to generate the laser radiation on the basis of a current that is fed in laterally by means of the first and the second area.

By arranging the laser strip laterally between the doped areas, the charge carriers may be fed laterally from the doped areas into the laser strip for generating the laser radiation. This enables the use of an additional degree of freedom in the implementation of such a laser arrangement, e.g. compared to lasers with a vertical feed-in of the charge carriers. For example, lateral and vertical apparatus designs may be fully or partially decoupled so that, e.g. in case of a LCI laser with an electrification current in a lateral direction, the vertical structure of the apparatus for generating laser radiation may be configured such that, e.g., the MQW and the confining layers may be optimized with respect to further parameters, such as the modal amplification.

According to embodiments of the present invention, the LCI laser arrangement comprises at least one tunnel structure, wherein the at least one tunnel structure is arranged in the first area and/or in the second area of the LCI laser arrangement, and wherein the at least one tunnel structure extends from the cavity in the intermediate layer to the surface, opposite the intermediate layer, of the LCI laser arrangement.

On the one hand, the tunnel structure enables a simple possibility for access so as to etch the cavity underneath the active layer of the intermediate layer. On the other hand, the tunnel structure enables a subsequent filling of the cavity. Through this, for example, the optical properties may be set with respect to an optical confinement of the generated laser radiation, which may improve the efficiency of the laser. In this case, the tunnel structure may be arranged in the first area or in the second area. Furthermore, there may be a multitude of tunnel structures, e.g. in the first area and in the second area. According to embodiments, a tunnel structure or a plurality of tunnel structures may be configured to or arranged to enable as good a thermal coupling of the LCI laser arrangement as possible. In this case, a tunnel structure may be composed of a single tunnel or hole or of a multitude of such elements.

According to embodiments of the present invention, the apparatus includes a passivation layer, and the passivation layer is arranged at least partially on the surface, opposite the intermediate layer, of the LCI laser arrangement. For example, the passivation layer may include silicon nitride (SiN) and may enable an electrical insulation of the apparatus and may provide protection against external influences to the apparatus. In particular, the passivation layer may include a low-refractive material, such as a material with a low refractive index. Through this, for example, the optical confinement of the generated laser radiation may be improved.

Further embodiments may also not comprise a passivation. The optical confinement mentioned further below would then also be adopted (e.g. even more effectively) by the air, for example as an ambient gas. To improve the electrical and mechanical protection of the surface, or e.g. to ensure the electrical and mechanical protection of the surface, embodiments may optionally include a passivation layer, e.g., wherein a minimally worse confinement is accepted.

According to embodiments of the present invention, the apparatus includes a first contacting and a second contacting, wherein the first contacting is arranged on the first area of the LCI laser arrangement, wherein the first contacting is configured to enable an electrical contact to the first area of the LCI laser arrangement. Furthermore, the second contacting is arranged on the second area of the LCI laser arrangement, and the second contacting is configured to enable an electrical contact to the second area of the LCI laser arrangement.

For example, the first and second contacting may be applied by means of sputtering and/or electroplating, and they enable the provision of the electrical connections for the apparatus, for generating the laser radiation and modulation and setting of the radiation.

According to embodiments of the present invention, the first contacting is arranged laterally between the tunnel structure and the laser strip of the LCI laser arrangement, and/or the second contacting is arranged laterally between the tunnel structure and the laser strip of the LCI laser arrangement.

Each contacting may be arranged close to the active layer so as to keep losses of the charge carriers as low as possible. This may maintain a high efficiency of the laser, and it may maintain a low energy consumption of the laser. In turn, the tunnel structure may be arranged close to the first and/or second contacting, for example, again close to the active layer, so that simple manufacturing of the cavity by means of an etching method may be possible. Through this, an inventive apparatus may be generated with low costs.

Optionally, the first contacting may also be arranged laterally on a side, opposite the laser strip, of the tunnel structure of the LCI laser arrangement, and furthermore, the second contacting may optionally be arranged laterally on a side, opposite the laser strip, of the tunnel structure of the LCI laser arrangement.

According to embodiments of the present invention, the apparatus includes a contacting layer, wherein the contacting layer comprises a doped semiconductor material, and wherein the contacting layer is arranged on the surface, opposite the intermediate layer, of the substrate.

Furthermore, the contacting layer includes a third contacting, wherein the third contacting is configured to enable an electrical contact to the contacting layer.

Here, the first contacting extends from the first area of the LCI laser arrangement to the contacting layer, and the third contacting is electrically connected to the first contacting via the contacting layer.

Alternatively, the second contacting extends from the second area of the LCI laser arrangement to the contacting layer, and the third contacting is electrically connected to the second contacting via the contacting layer.

For example, the contacting layer may include n-InP. A substrate-rear side contacting, for example an n-contacting of the LCI laser arrangement, may be provided by means of the third contacting. Through this, e.g., an inventive apparatus may be contacted in a planar manner from the front side and from the back side, which may simplify an integration and reduce the integration complexity.

According to embodiments of the present invention, the laser strip of the LCI laser arrangement includes at least one multi-quantum well package; and the laser strip of the LCI laser arrangement includes waveguide layers.

By using the multi-quantum well package, an inventive apparatus for generating laser radiation of a short wave length may be used, depending on the multi-quantum well package, so that, for example, a limitation with respect to the generated wave length due to the band gap of the semiconductor material used is lower than the dependence on properties, for example the geometry, of the multi-quantum well package. In addition, the use of the multi-quantum well package and the waveguide enable a good efficiency of inventive lasers. The waveguides may optically confine the generated laser radiation within the laser strip and therefore decrease losses. In addition, for example, the current introduced into the laser strip may be fed into the multi-quantum well package. Selective introduction into the multi-quantum well package may have advantages.

For example, amplification of the light may actually only take place in the MQW. Accordingly, the "application" of the current may also be relevant for this area only. While a portion of the current may be injected into the other layers of the laser strip as well, this current portion, e.g., may be lost (lost in that the current introduced outside of the MQW does not lead to an amplification of the laser radiation) and may therefore be regarded as being parasitic. Accordingly, such a current application may improve the efficiency factor of the inventive laser.

In general, for example, the multi-quantum well package (MQW) may form the active area of the laser strip.

Accordingly, the adjacent first and second doped areas may be configured, e.g. in case of a potential difference being present, to apply a current into the MQW such that, e.g., no or only small parasitic currents are introduced into areas of the laser strip that do not include the MQW.

In other words, the adjacent first and second doped areas may be configured, e.g. in case of a potential difference being present, to apply a current into the laser strip such that the majority of the current, e.g. at least 60% or at least 80% or at least 90% or at least 99% of the applied current, is introduced into the MQW.

According to embodiments, the laser strip may accordingly also be structured such that a majority of a laterally applied current is guided through the area of the laser strip that includes the MQW.

According to embodiments of the present invention, the waveguide layers are semi-insulating waveguide layers, and the semi-insulating waveguide layers are arranged vertically above and below at least one multi-quantum well package. The advantage of the semi-insulation of the waveguide layers is that the undesired charge carrier injection may be reduced to a minimum in these areas and may instead be focused more heavily in the area of the MQW where the amplification takes place.

According to embodiments of the present invention, the cavity and/or the at least one tunnel structure comprises a filler.

For example, the filler may include a gas, such as air, or a liquid or a solid material, e.g. BCB may be used. For example, the cavity structure may be filled with the filler via the tunnel structure. For example, the filler may be a liquid that hardens or is cured. For example, this may improve the structural integrity of the apparatus. Furthermore, a planar surface may be created by filling the tunnel structure.

In addition, the thermal coupling to the substrate may be improved by means of the filler. Since the laser (active component) may become hotter than its surroundings (e.g. the substrate) and since higher temperatures may be bad for the performance of any semiconductor laser, it may be advantageous, e.g., to have as good a thermal connection as possible. Thus, for example, a filler may be introduced that optically confines the laser radiation well and at the same time provides a possibility to dissipate the heat of the laser.

In addition, however, an operation at very low powers and therefore at a reduced development of heat is actually made possible by the cavity structure so that, e.g., bad heat coupling may be an effect one has to accept (and that one is able to accept). In other words, a gain of efficiency by means of the semiconductor structure, e.g., with respect to the optical confinement, may outweigh possible disadvantages, e.g., with respect to the thermal coupling.

According to embodiments of the present invention, the filler is configured to optically confine the laser radiation in the laser strip of the LCI laser arrangement.

The filler may be a low-refractive material, e.g., a material having a low refractive index. Thus, the laser radiation adjacent in the laser strip may be optically confined, which may decrease losses. Thus, the inventive apparatus may have a good efficiency.

According to embodiments of the present invention, the intermediate layer may be selectively etched in contrast to the first and second areas of the LCI laser arrangement.

Through this, the inventive apparatus, e.g., may be processed with an etching agent with low effort so that the etching agent, introduced via the tunnel structure, may be used to generate the cavity without damaging the first and second areas of the LCI arrangement, e.g., with respect to its later functionality for the laser strip. Thus, the apparatus may be manufactured at low costs.

According to embodiments of the present invention, the substrate comprises indium phosphide; and/or the first and second area of the LCI laser arrangement comprise indium phosphide. Alternatively or additionally, the laser strip of the LCI laser arrangement comprises indium gallium arsenide phosphide and/or the passivation layer comprises silicon nitride. Furthermore, alternatively or additionally, the contacting layer comprises indium phosphide with the first or with the second doping.

Through the inventive arrangement of the cavity structure, a substrate made of indium phosphide may be used, which may enable an integration with other optical components on a common indium phosphide substrate. Through the selection of the material, an inventive laser may have a good efficiency, e.g., by optically confining the laser radiation in the laser strip through low-refractive SiN.

According to embodiments of the present invention, the apparatus includes an optical component, wherein the optical component and the LCI laser arrangement are monolithically integrated on the substrate.

As explained above, the cavity structure enables a degree of freedom in the selection of the substrate so that systems with optical components that may be realized with low effort and costs on a common substrate are possible.

According to embodiments of the present invention, the optical component is a photonic integrated circuit, and the LCI laser arrangement is optically coupled to the photonic integrated circuit. In addition, the LCI laser arrangement is configured to provide the laser radiation for the photonic integrated circuit.

Through the inventive structure, the above explained high requirements with respect to the heat development and the optical output power as well as the modulation speed may be achieved so that an integration in PICs may be made possible.

Further embodiments according to the present invention include a method for manufacturing an apparatus for generating laser radiation, including (a) generating an intermediate layer on a semiconductor substrate, (b) generating a Lateral Current Injection (LCI) laser arrangement on the intermediate layer, and (c) generating a cavity in the intermediate layer, wherein the cavity extends at least under a laser strip of the LCI laser arrangement.

Methods according to the present invention are based on the same, analogous, or similar considerations as the associated inventive apparatus. As a result, all features and functionalities described above in the context of an apparatus may be integrated analogously or accordingly into an associated method, or may be used or applied for an associated method, individually and in combination. As a result, a corresponding method or a corresponding method step may also have the same or analogous advantages of an associated apparatus and an associated apparatus feature, respectively.

According to embodiments of the present invention, step (b) further includes (b1) generating a layer sequence on the intermediate layer, wherein the layer sequence includes a plurality of layers of a laser strip of the LCI laser arrangement, (b2) thinning a part of the layer sequence in a first and a second area of the layer sequence (410) so that the laser strip of the LCI laser arrangement is defined, (b3) arranging a semiconductor material with a first doping in the first area so that a first area of the LCI laser arrangement is defined, and (b4) arranging a semiconductor material with a second doping, different from the first doping, in the second area so that a second area of the LCI laser arrangement is defined.

In the manufacturing process, the layer sequence may be thinned in a first and second area. In the thinned or stripped-away areas of the layer sequence, the doped semiconductor materials may be subsequently arranged. For example, by partially stripping away or thinning the layer sequence, an inventive apparatus may be manufactured with low efforts as to time and costs. After arranging the respective doped semiconductor, the areas in which the layer sequence has been stripped away may form the first and the second area of the LCI laser arrangement material.

According to embodiments of the present invention, step (b2) includes removing, e.g. fully removing, the part of the layer sequence in the first and the second area of the layer sequence so as to expose a first and a second area of the intermediate layer.

Thinning a part of the layer sequence may be performed such that a first and a second area of the intermediate layer is exposed. Removing a partial area of the layer sequence does not necessarily lead to exposing the intermediate layer. According to embodiments, removing, as explained above, may also be carried down up to a slightly lower depth than to the intermediate layer. In case of fully exposing a first and a second area of the intermediate layer, the respective doped semiconductor material may subsequently be arranged on these areas. The doped semiconductor material may again be arranged on the first and the second area of the layer sequence in which the layer sequence has been previously removed, and may therefore form the first and the second area of the LCI laser arrangement.

According to embodiments of the present invention, the layer sequence includes at least two semiconductor materials with different band gaps.

By using a layer sequence with semiconductor materials of different band gaps, further degrees of freedom are provided for the optimization of an inventive apparatus so that the respective selection of the material may be carried out in an application-specific manner. In particular, through this, the MQW and the waveguides may be provided in the layer sequence. Thus, the laser strip may be generated with a lower complexity and a lower manufacturing effort.

According to embodiments of the present invention, steps (b3) and (b4) each include epitaxially growing the semiconductor material with the first/second doping in the first/second area.

Thus, the doped semiconductor material may be epitaxially grown in the first and second areas of the layer sequence in which the layer sequence has been previously removed. By epitaxially growing, the semiconductor areas may be generated with precisely set properties. Thus, for example, doping profiles may be set with high precision. In addition, abrupt transitions of the doping agent concentration and particularly pure semiconductor structures may be generated through epitaxy.

According to embodiments of the present invention, step (b2) includes generating an etching mask on at least a part of the layer sequence through lithographic methods.

In other words, step (b2) includes generating etching masks through lithographic methods. Lithographic methods enable the generation of precisely placed and defined masks (etching masks) for the following etching methods so that, e.g., inventive apparatuses may be generated with very precisely defined geometries.

According to embodiments of the present invention, step (b) further includes (β1) generating a layer sequence on the intermediate layer, wherein the layer sequence includes a plurality of layers of a laser strip of the LCI laser arrangement, (β2) depositing a thin etching mask onto the layer sequence through a lithographic method, (β3) thinning the unmasked part of the layer sequence in a first area of the layer sequence, (β4) epitaxially growing a semiconductor material with a first doping in the first area so that a first area of the LCI laser arrangement is defined, (β5) removing the first etching mast, (β6) depositing a second etching mask onto an area, forming the layer strip of the LCI laser arrangement, of the layer sequence through a lithographic method, and onto the semiconductor material with the first doping in the first area of the LCI laser arrangement, (β7) thinning the unmasked part of the layer sequence in a second area of the layer sequence, (β8) epitaxially growing a semiconductor material with a second doping, different from the first doping, in the second area so that a second area of the LCI laser arrangement is defined, and (β9) removing the second etching mask.

For example, step (β3) may include removing the unmasked part of the layer sequence to expose a first area of the intermediate layer. Accordingly, step (β7) may include removing the unmasked part of the layer sequence to expose a second area of the intermediate layer. According to embodiments, thinning a part of the layer sequence on which an etching mask is not arranged may include fully removing, i.e., up to the intermediate layer underneath, a part of the layer sequence or partially removing, or thinning. For example, the layer sequence may be thinned above the first and the second area of the intermediate layer so that, in the following, the respective doped semiconductor material may be applied by means of epitaxial growing above these areas (in the first and the second area of the layer sequence that was thinned).

Manufacturing by using etching masks by means of lithographic methods enables a cost efficient and precisely adjustable possibility to produce an inventive apparatus.

According to embodiments of the present invention, depositing the first and/or second etching mask further includes depositing a material layer at least on one part of the layer sequence, generating an etching mask on at least a part of the material layer by means of a lithographic method, and partially removing the material layer outside of the at least one part of the material layer.

The material layer may serve as a passivation against the etching masks, or in other words the masking, e.g., to keep the stress of the existing layers low with respect to the etching masks to be removed so that no or only few undesired damages or changes are generated through the lithography and etching steps. For example, the material layer may include silicon nitride and/or silicon oxide.

In other words, the generation of the etching masks through lithographic methods may be carried out on a material layer, such as silicon nitride and/or silicon oxide, which was previously deposited onto the layer sequence and is subsequently partially removed (according to the lithographic mask). This result serves, e.g., as the etching mask for the subsequent steps, such as thinning the unmasked part of the layer sequence in a first area of the layer sequence, e.g., to expose a first area of the intermediate layer.

According to embodiments of the present invention, thinning part of the layer sequence includes a selective dry etching method. For example, through a dry etching method, the tunnel structure may be generated with a defined geometry and a reduced time effort.

According to embodiments of the present invention, step (b) or step (c) further includes depositing a passivation layer onto the LCI laser arrangement.

As described above, the passivation layer may include a low-refractive material, such as silicon nitride (SiN), and may enable electrical insulation of the apparatus and may also provide a protection against external influences to the apparatus. Through this, for example, the optical confinement of the generated laser radiation may be improved.

According to embodiments of the present invention, step (b) or step (c) further includes depositing a first contacting on the first area of the LCI laser arrangement, wherein the first contacting is configured to enable an electrical contact to the semiconductor material with the first doping, and depositing a second contacting on the second area of the LCI laser arrangement, wherein the second contacting is configured to enable an electrical contact to the semiconductor material with the second doping.

The electrical contacting may be deposited during the generation of the Lateral Current Injection (LCI) laser arrangement or during the generation of a cavity. The contacting may be formed by means of metal contacts that, e.g., may be arranged on the n-conductive and p-conductive area laterally along the laser strip, e.g., by means of sputtering and/or electroplating.

According to embodiments of the present invention, step (c) further includes (c1) generating at least one tunnel structure in the first and/or in the second area of the LCI laser arrangement, wherein the at least one tunnel structure extends from the surface, opposite the intermediate layer, of the LCI laser arrangement to the intermediate layer so as to at least partially expose the intermediate layer, and (c2) generating the cavity in the intermediate layer by using the at least one tunnel structure.

Through the tunnel structure, there is a simple possibility to etch the cavity underneath the laser strip. Furthermore, a filler may be introduced into the cavity by means of the tunnel structure so as to, e.g., improve certain properties of the laser, e.g., to enable the optical confinement of the generated laser radiation in the laser strip by using a low-refractive filler to decrease losses and to therefore enable a high efficiency of the laser.

Furthermore, the filler may enable an improvement of the stability and/or an improvement of the heat dissipation. For example, the filler may also be an ambient gas such as air. Accordingly, introducing a filler may also be characterized in that an ambient gas enters the cavity structure.

Air as a filler may be very good or even the best choice, e.g., with respect to an optical confinement so that, e.g., leaving the cavity empty so that ambient air may enter the cavity may form an advantageous embodiment.

According to embodiments of the present invention, step (c1) further includes (c11) depositing a third etching mask onto the LCI laser arrangement through lithographic methods, and (c12) generating the at least one tunnel structure in the first and/or the second area of the LCI laser arrangement by means of a dry etching method. In addition, step (c2) further includes (c21) introducing a selective etching solution into the at least one tunnel structure, and (c22) etching the intermediate layer by using the etching solution for generating the cavity.

Through the process steps, the inventive apparatus may be manufactured with a low effort. By using fully developed methods such as lithography and a combination of dry etching methods and the use of an etching solution, the inventive apparatus may be generated with precisely defined geometries.

According to embodiments of the present invention, depositing the third lithographic etching mask further includes depositing a material layer on at least a part of the LCI laser arrangement, generating an etching mask on at least a part of the material layer through a lithographic method, and partially removing the material layer outside of the at least one part of the material layer.

As previously described, the material layer may serve as a passivation against the masking (etching mask) to suppress the stress of the available layers with respect to the masking to be removed, so that no, or only few, undesired damages or changes are generated through the lithography and etching steps.

According to embodiments of the present invention, the method further includes (d1) filling the cavity and/or at least a tunnel structure with a liquid filler, and (d2) curing the liquid filler.

Through this, for example, the cavity may be fully filled, and the structural integrity of the apparatus may still be ensured.

BRIEF DESCRIPTION OF THE DRAWINGS

Embodiments of the present invention will be detailed subsequently referring to the appended drawings, in which:

FIG. 7 (part 1, part 2, and part 3) shows schematic side views of manufacturing steps of a method according to the present invention for manufacturing an apparatus for generating laser radiation.

DETAILED DESCRIPTION OF THE INVENTION

Figure 1:
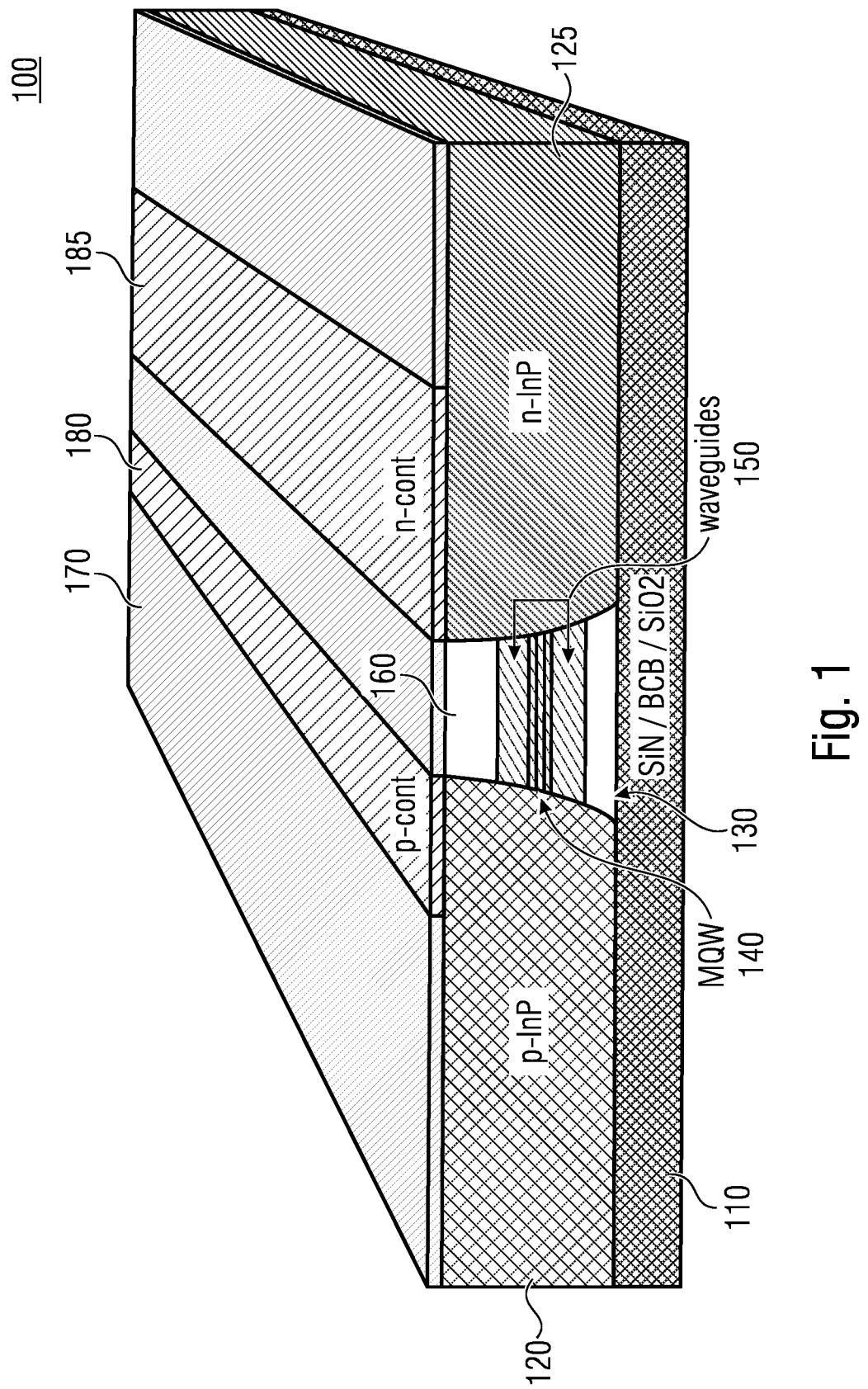
FIG. 1 shows a schematic side view of a LCI structure bonded onto a low-refractive material.

Before embodiments of the present invention are subsequently described in more detail on the basis of the drawings, it is to be noted that identical or functionally identical elements, objects and/or structures or elements, objects and/or structures having the same effect are provided in the different figures with the same or similar reference numerals so that the description of these elements illustrated in different embodiments is interchangeable or maybe applied to one another.

Figure 2:
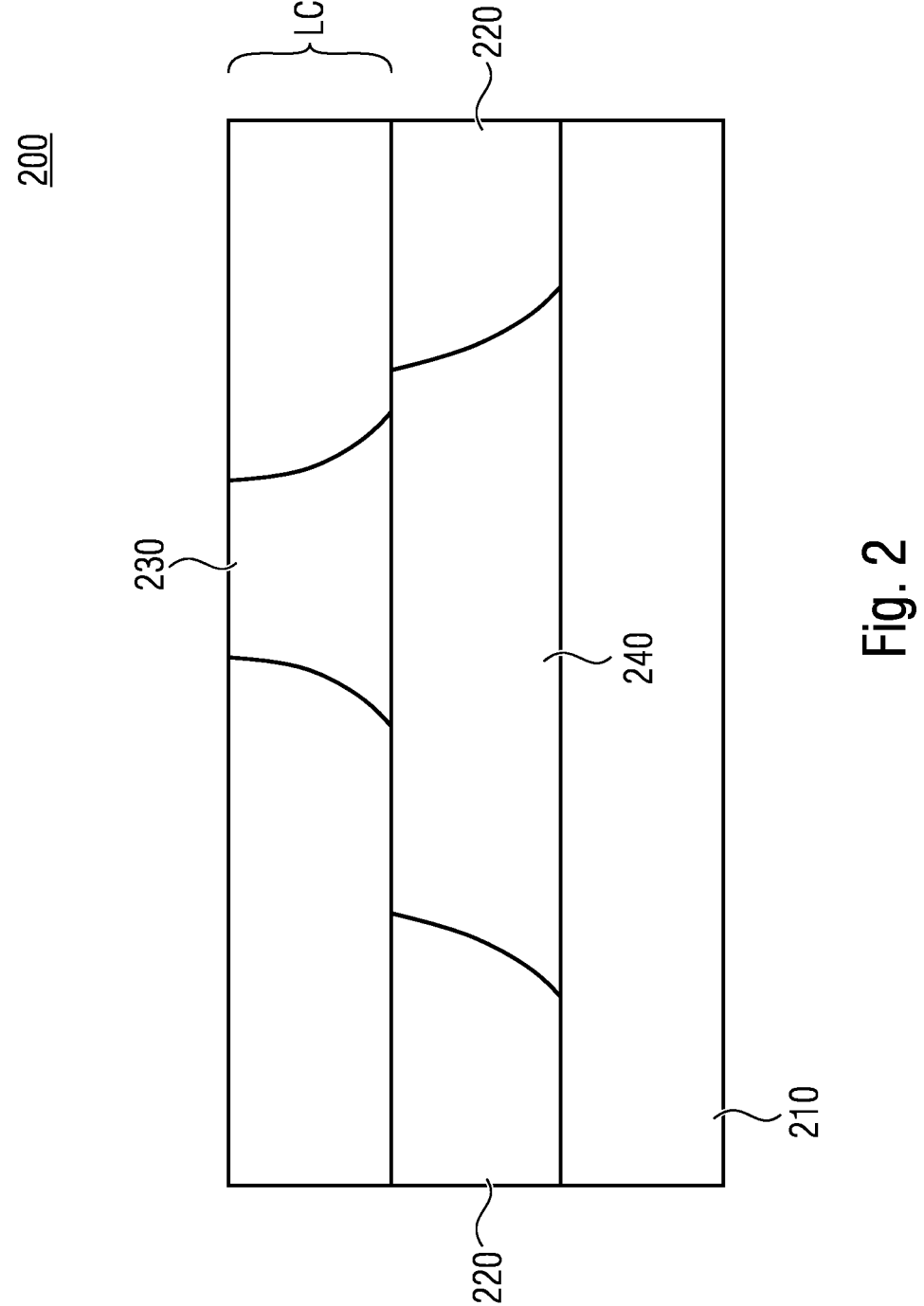
FIG. 2 shows a schematic side view of an apparatus for generating laser radiation according to embodiments of the present invention.

FIG. 2 shows a schematic side view of an apparatus for generating laser radiation according to embodiments of the present invention. FIG. 2 shows the apparatus 200 with a semiconductor substrate 210, an intermediate layer 220 arranged on the semiconductor substrate, a Lateral Current Injection (LCI) laser arrangement LCI arranged on the intermediate layer, a laser strip 230, and a cavity 240 extending in the intermediate layer 220 under the layer strip 240 of the laser arrangement.

Charge carriers may be fed into the laser strip 230 laterally via the lateral areas of the LCI laser arrangement so as to generate the laser radiation. To enable a high efficiency, it is advantageous to configure the area adjacent to the laser strip such that the laser radiation, if possible, is not coupled out of the laser strip 230 in an undesired way, and is therefore lost. The cavity 240 enables this "optical confinement" of the laser radiation in the laser strips 240, e.g., regardless or at least approximately regardless of the selection of the substrate material. Thus, a substrate 210 may be used that, e.g., does not have optimum properties with respect to an optical confinement (or limitation) of the laser radiation but that is suitable for an integration with further optical components such as INP (indium phosphide) or SI—InP (semi-insulating indium phosphide).

Figure 3:
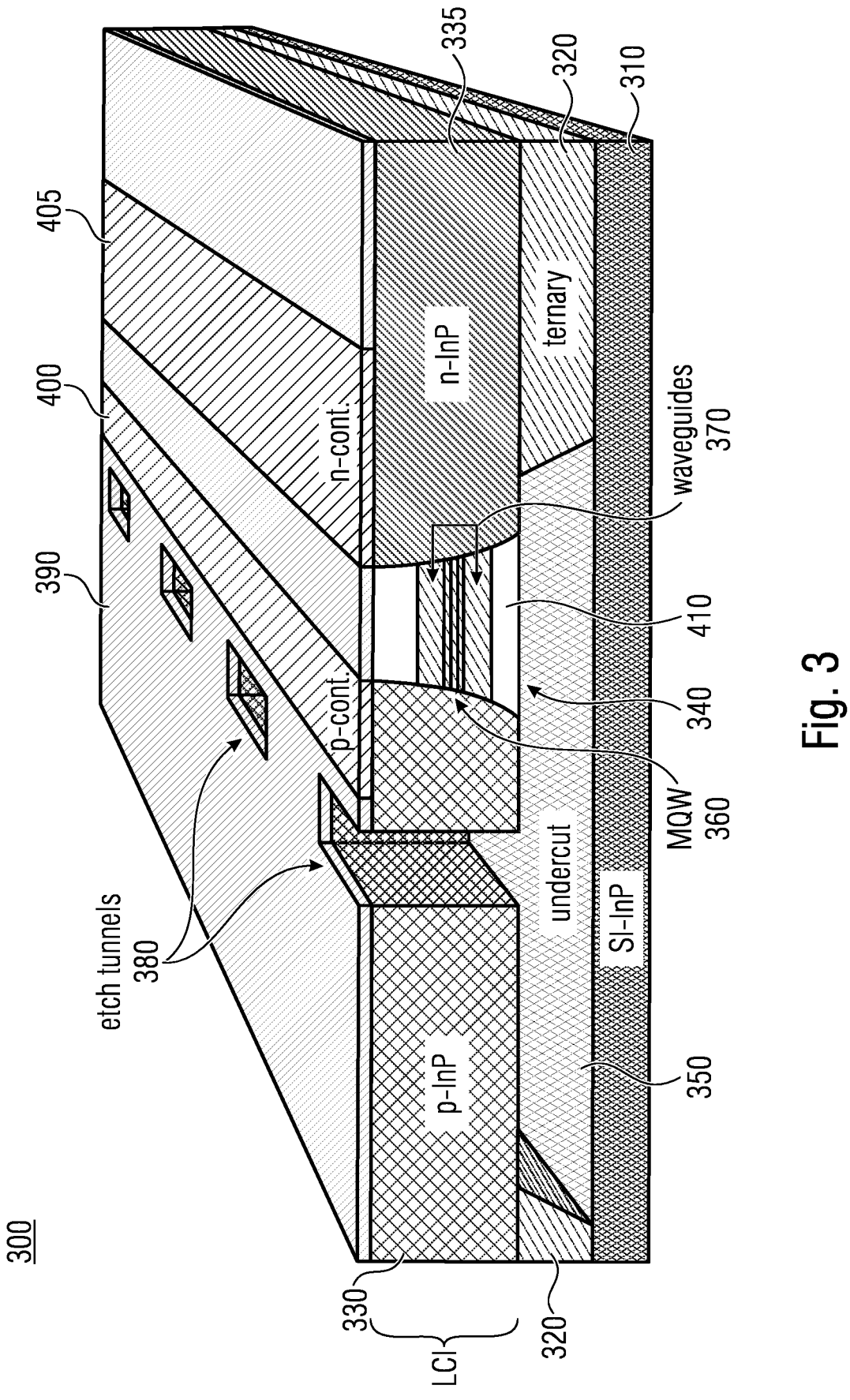
FIG. 3 shows a schematic side view of an apparatus for generating laser radiation with additional optional features according to embodiments of the present invention.

FIG. 3 shows a schematic side view of an apparatus for generating laser radiation with additional optional features according to embodiments of the present invention. FIG. 3 shows an example of an inventive scheme of a Lateral Current Injection laser chip with an under-etched (or undercut) waveguide. In other words, embodiments include LCI laser chips with a locally hollowed out membrane structure. FIG. 3 shows an apparatus 300 with a semiconductor substrate 310, wherein the semiconductor substrate 310 optionally includes semi-insulating InP. An intermediate layer (ternary) 320 is arranged on the semiconductor substrate 310. In turn, a Lateral Current Injection (LCI) laser arrangement, i.e. e.g. the membrane structure, is arranged on the intermediate layer 320.

The LCI arrangement includes a first area (p-InP) 330 with a first doping (here a p-doping as an example) and a second area (n-InP) 335 with a second doping (here an n-doping as an example). The laser strip 340 is arranged between the first area 330 and the second area 335 of the LCI laser arrangement. Via the differently doped areas 330, 335, a current may be fed in laterally into the laser strip 340, or a voltage leading to a feeding current may be provided for the laser strip 340. In this case, the laser strip 340 is configured to generate laser radiation by means of the current that is provided. The current is applied into the laser strip 340 laterally, or simply put, from the side in the side view of FIG. 3. Thus, an inventive apparatus comprises the above explained degrees of freedom with respect to the implementation of the apparatus in the vertical direction, since a current is not fed in from there, as is the case with lasers with a vertical current application.

A cavity (undercut) 350 is arranged in the intermediate layer 320, between the semiconductor substrate 310 and the LCI laser arrangement, at least in an area of the laser strip 340 of the LCI laser arrangement. The cavity 350 is configured to optically confine in the laser strip of the LCI laser arrangement the laser radiation generated in the laser strip 340. For example, the laser radiation is kept in the laser strip by means of the cavity 350 so that as little generated radiation as possible is unintentionally coupled out into the substrate and is lost. This achieves a high efficiency factor.

To generate the laser radiation, the laser strip optionally includes one or several multi-quantum well (MQW) packages 360 that may form the active area of the laser strip, as well as waveguides 360. As explained above, the doped areas 330, 335 may be configured to apply a feed-in current into the laser strip such that the feed-in current mostly (e.g. by at least 60% or at least 80% or at least 90% or at least 99%) is applied into the MQW 360. Alternatively or additionally, the MQW 360 may be arranged in the laser strip 340 between the doped areas 330 and 335 and the waveguides 370 so that the majority of a feed-in current applied through the doped area is guided through the MQW. For example, this may have advantages since the amplification of the light mainly, or even exclusively for example, may take place in the MQW 360. Accordingly, it may be advantageous to apply a current, e.g., only or mainly in this area

360. While a portion of the current may be dissipated into the other layers of the laser strip 340, this current portion may form parasitic losses since the energy transmitted therewith cannot be used to generate laser radiation in the MQW 360, for example.

Accordingly, as described above, via the differently doped areas 330, 335, a current may be fed into the MQW 360 laterally, or a voltage leading to a feed-in current may be provided for the MQW 360. In this case, the MQW 360 may be configured to generate laser radiation by means of the current that is provided. In this case, the current is applied laterally into the MQW 360, or simply put, from the side in the side view of FIG. 3.

In this case, the waveguide layers 370 may be configured as semi-insulating waveguide layers. The waveguide layers enable the optical confinement of the generated laser radiation in the laser strip 340 so as to decrease losses. The waveguide layers 370 may be arranged around the MWQ packages 360, e.g., perpendicularly with respect to the substrate surface above and below the at least one MWQ package 360, e.g., so that the laser radiation is efficiently confined, but at the same time the feed-in current may be appropriately fed in by the doped areas 330, 335. Accordingly, a feed of the MQW 360 may be carried out laterally, and an optical confinement may be carried out vertically. The first and second areas 330, 335 may also be configured to optically confine the laser radiation in the active area 360.

The cavity 350 may optionally comprise a filler. For example, in this case, the filler may be a gas such as air. However, liquid and/or solid fillers are possible, e.g., a liquid filler that is curable and in its cured state may contribute to the stability of the arrangement. The filler further has the advantage that it may be implemented for the optical confinement of the generated laser radiation in the laser strip 340. Thus, a filler may be used that leads to very low losses with respect to the generated laser radiation.

The apparatus 300 further includes a tunnel structure 380, including one or several tunnels, such as etch tunnels. FIG. 3 exemplarily shows 4 etch tunnels, however, a tunnel structure may only comprise one tunnel (or more than 4 etch tunnels). Optionally, as shown, the tunnel structure 380 may only be arranged in one of the two areas 330, 335. In this case, tunnels of one or several tunnel structures may also be arranged in both areas 330, 335. The tunnel structure 380 connects a surface of the apparatus 300 to the cavity 350.

As is shown in FIG. 3, the tunnel structure may extend from the cavity beyond the surface of the LCI arrangement through an additional optional passivation layer 390. The passivation layer 390 is at least partially arranged on the surface, opposite the intermediate layer, of the LCI laser arrangement. Thus, in particular, the doped areas 330 and 335 may be electrically shielded so that no leaking currents or as little leaking currents as possible may be created.

The apparatus 300 further comprises a first contacting 400 and a second contacting 405. The first contacting 400 is deposited on a part of the area with the first doping 330 and forms an electrically conductive connection to the exemplarily p-doped semiconductor. The second contacting 405 is deposited on a part of the area with the second doping 335 and forms an electrically conductive connection to the exemplarily n-doped semiconductor. An external feeding current may be fed into the MQW 360 via the electrical contacting through the first and second doped area 330, 335.

As additionally and optionally shown in FIG. 3, according to embodiments, the first contacting 400 may be arranged laterally between the tunnel structure 380 and the laser strip 340 of the LCI laser arrangement. In case of further tunnel structures above the n-doped area, according to embodiments, the second contacting is also arranged laterally between the tunnel structure and the laser strip of the LCI laser arrangement.

Optionally, in contrast to the first and second areas 330, 335 of the LCI laser arrangement, the intermediate layer 320 may be selectively etched. For example, in contrast to the first and second areas 330, 335, the intermediate layer may be sensitive to different etching agents.

As is shown in FIG. 3, the laser strip 340 of the apparatus 300 may include a layer sequence 410. The layer sequence 410 includes a plurality of layers of a laser strip of the LCI laser arrangement, e.g. the MQW package 360 and the waveguide layer 370.

Figure 4:
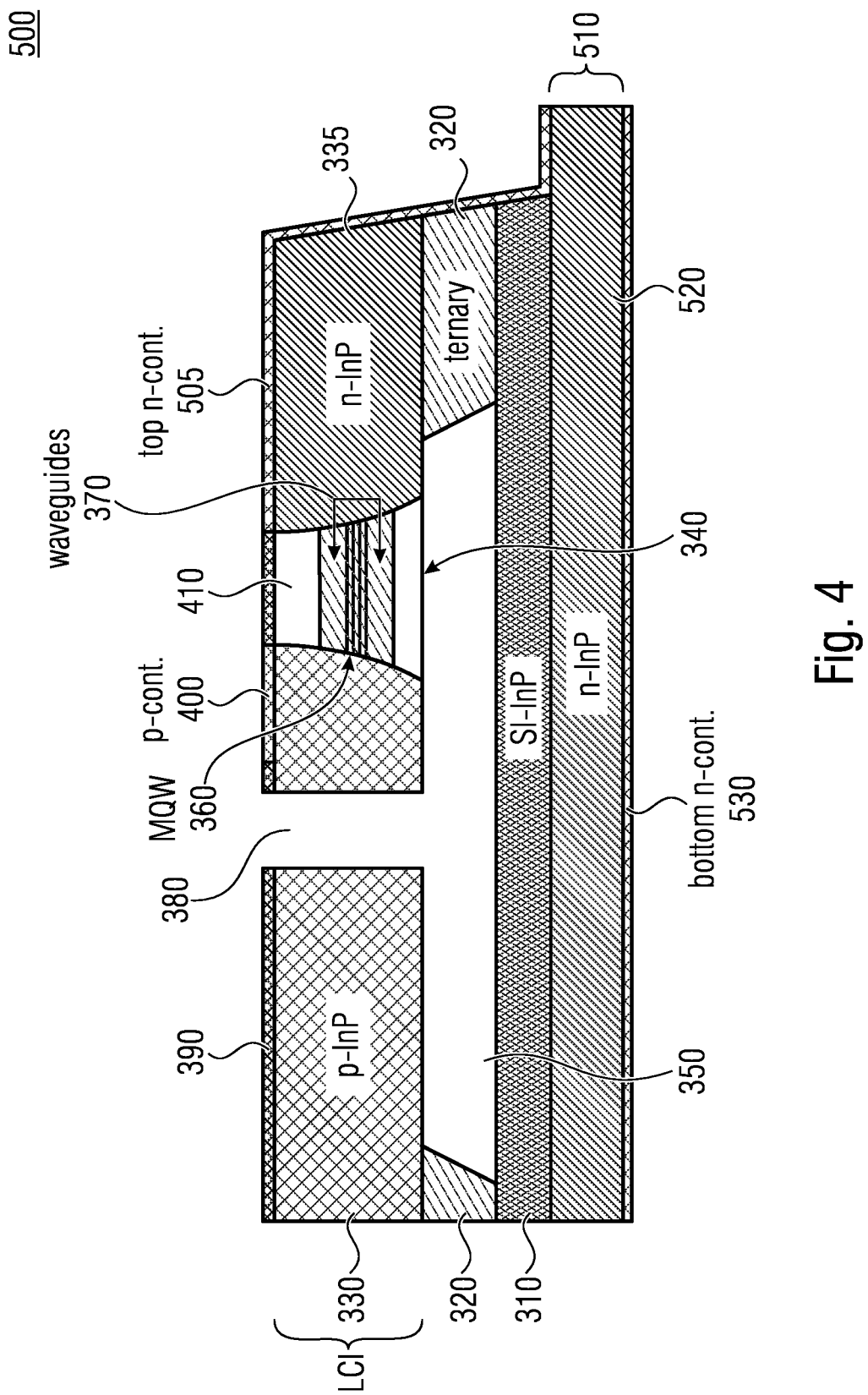
FIG. 4 shows a schematic side view of an apparatus for generating laser radiation with a rear-side contacting according to the embodiments of the present invention.

FIG. 4 shows a schematic side view of an apparatus for generating laser radiation with a rear-side contacting according to embodiments of the present invention. In other words, FIG. 4 shows an inventive realization of a rear-side n-contact in case of a LCI laser. FIG. 4 shows the apparatus 400 with the elements previously described in the context of FIG. 3. According to the embodiment shown in FIG. 4, inventive apparatuses may include a rear-side contacting. To this end, the apparatus 500 includes a contacting layer 510 (n-InP+bottom n-cont.). The contacting layer 510 comprises a doped semiconductor material 520 (n-InP, here n-doped indium phosphide as an example) and is arranged on the surface, opposite the intermediate layer 320, of the substrate 310. A third contacting 530 (bottom n-cont.) is deposited on the doped semiconductor material 510. In this case, the third contacting 530 provides an electrical connection to the contacting 505 (top n-cont.) of the second doped area 335 via the doped semiconductor material 520. A corresponding contacting may be configured analogously to the manufacturing of a rear-side contact with the p-doped area 330.

Thus, the contacts to the doped areas may each be done out from the front and rear sides so that, in particular, the rear side contacting, i.e. e.g. a contacting of the third contacting 530, may be carried out in a planar manner.

In other words, according to embodiments, a substrate-rear side n-contacting of the lasers, as is illustrated in FIG. 4, may be made possible, e.g., when using a n-InP substrate.

In general, e.g., the following materials may be used: The substrate 310 and/or the first and second areas 330, 335 of the LCI laser arrangement may comprise indium phosphide. The laser strip of the LCI laser arrangement 340 may comprise indium gallium arsenide phosphide, and the passivation layer may comprise silicon nitride. Alternatively or additionally, the contacting layer 510 for the doped semiconductor material 520 may comprise indium phosphide with the first or with the second doping.

Figure 5:
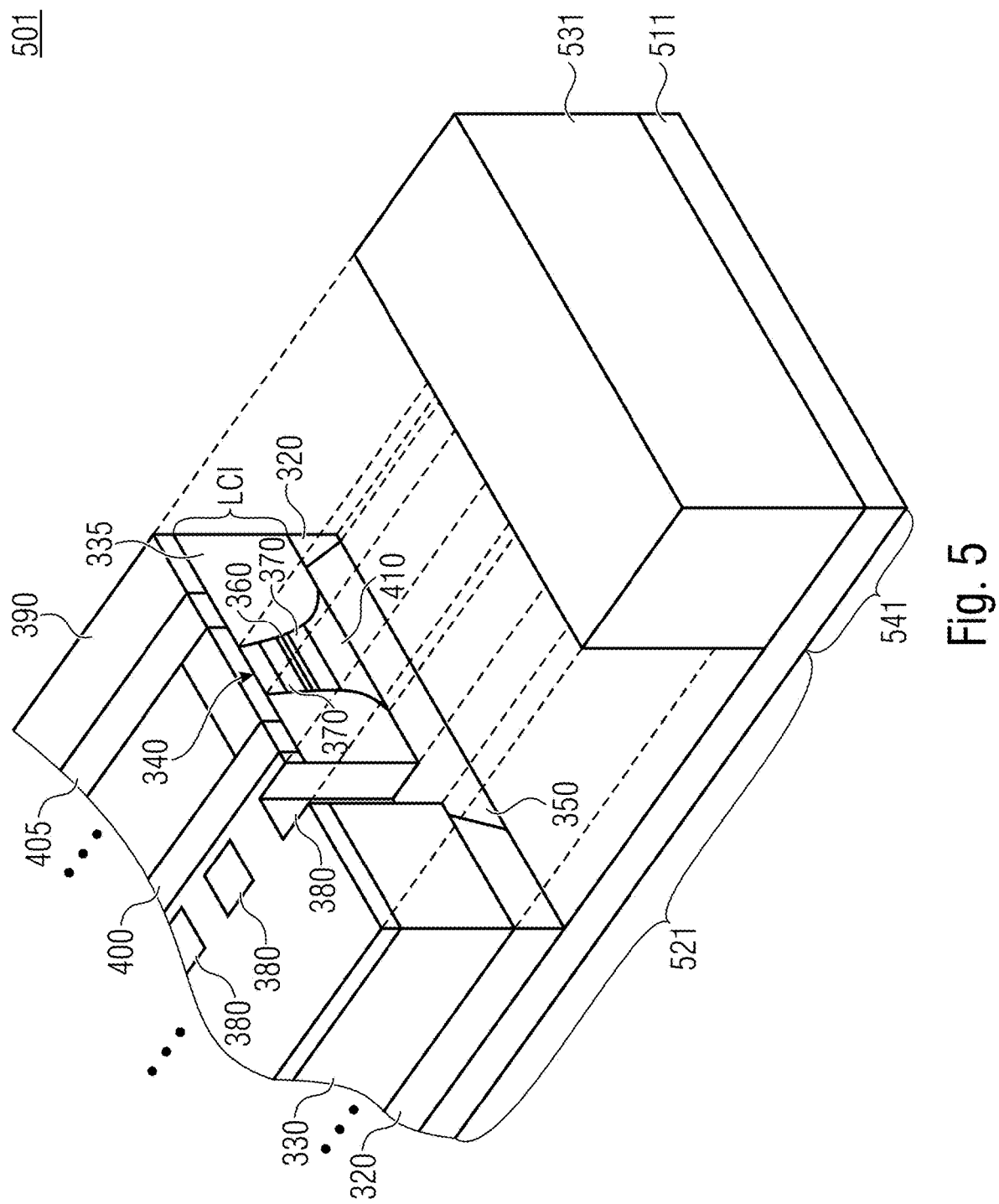
FIG. 5 shows a schematic side view of an apparatus with an optical component according to embodiments of the present invention.

FIG. 5 shows a schematic side view of an apparatus with an optical component according to embodiments of the present invention. FIG. 5 shows the apparatus 501 including the semiconductor material 511. The substrate 511 forms a common substrate for portions 521 of the apparatus configured to generate the laser radiation and including the previously mentioned elements and the optical component 531 arranged in the portion 541. The optical component 531 and the LCI laser arrangement are monolithically integrated on the substrate 511. Optionally, e.g., the optical components may be a photonic integrated circuit. For example, in this case, the LCI laser arrangement may be coupled optically to the photonic integrated circuit and may be configured to provide the photonic integrated circuit with laser radiation. In other words, the LCI arrangement and the PIC may be arranged monolithically on the substrate such that the LCI arrangement is able to couple in laser radiation into the PIC.

For example, through the inventive use and the corresponding arrangement of the intermediate layer in the cavity contained therein, a substrate 511 suitable for a simple manufacturing and a well manageable integration of optical components may be used so that, e.g., a very high integration density may be achieved on the common substrate.

Figure 6:
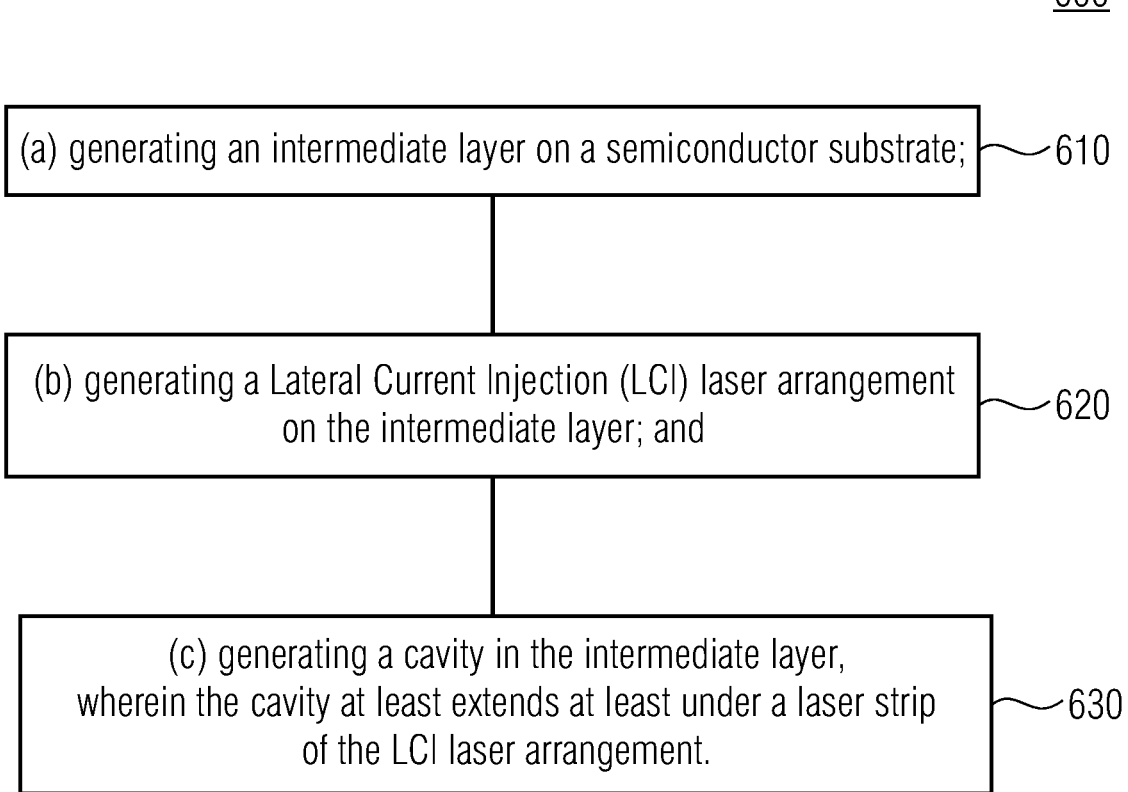
FIG. 6 shows a schematic block diagram of a method for manufacturing an apparatus for generating laser radiation according to embodiments of the present invention.

FIG. 6 shows a schematic block diagram of a method for manufacturing an apparatus for generating laser radiation according to embodiments of the present invention. A method 600 includes (a) generating 610 an intermediate layer on a semiconductor substrate, (b) generating 620 a Lateral Current Injection (LCI) laser arrangement on the intermediate layer, and (c) generating 630 a cavity in the intermediate layer, wherein the cavity extends at least under a laser strip of the LCI laser arrangement.

Figure 7:
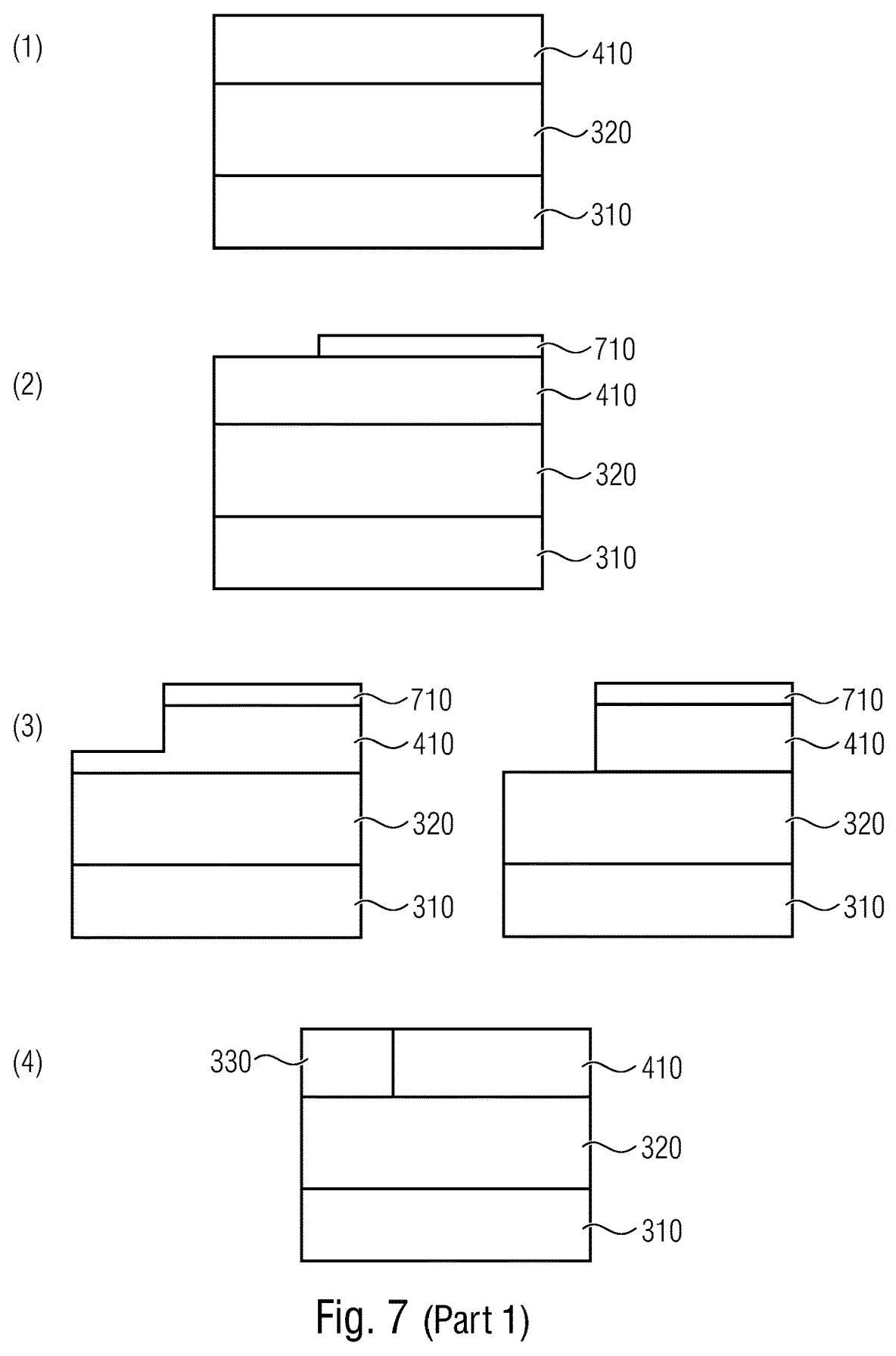

FIG. 7 shows schematic side views of manufacturing steps of a method according to the present invention for manufacturing an apparatus for generating laser radiation. Inventive aspects of manufacturing methods according to embodiments are described in more detail in the following with reference to the steps shown in FIG. 6 and with the help of FIG. 7.

FIG. 7 (1) shows a semiconductor substrate 310 having arranged thereon an intermediate layer 320 according to step (a). To generate a Lateral Current Injection (LCI) laser arrangement on the intermediate layer, a layer sequence 410 may be arranged on the intermediate layer 320. As explained above, the layer sequence 410 includes a plurality of layers that form the laser strip of the LCI laser arrangement in the inventive apparatus.

To generate the laser strip, furthermore, parts of the laser sequence 410 may be thinned or removed. As exemplarily shown in FIG. 7 (2), this may include depositing a first etching mass (lithographic masking) 710 onto the layer sequence 410 through a lithographic method. The etching mask 710 may protect the layers underneath against a subsequent at least partial removal of the unmasked part of the layer sequence. FIG. 7 (3) shows two possible inventive results of the removal of the unmasked part of the layer sequence 410. As shown in FIG. 7 (3) on the left, removing may be performed incompletely such that the intermediate layer is not exposed by the removal. FIG. 7 (3) shows on the right the case in which, e.g., the above layer sequence has been removed down to the intermediate layer, e.g. by etching. For example, the time for an etching step may be saved through thinning or partially stripping away. After stripping away, the laser strip of the LCI arrangement is defined in at least a first part.

The explanation of the further optional process steps is exemplarily continued with FIG. 7 (3) on the right.

Subsequently, as is shown in FIG. 7 (4), arranging a semiconductor material with a first doping on the one first area of the intermediate layer may be carried out so that a first area 330 of the LCI laser arrangement is defined. Arranging the semiconductor material may be performed by epitaxial growing. As is shown in FIG. 7 (4), after epitaxial growing, the first etching mask 710 may be removed.

Analogously, as is shown in FIG. 7 (5)-(7), a semiconductor material with a second doping, different from the first doping, may be arranged on a second area of the intermediate layer 320 so that a second area 335 of the LCI laser arrangement is defined. To this end, by means of a lithographic method, an etching mask (lithographic masking) 720 may again be deposited on an area, forming the laser strip of the LCI laser arrangement, of the layer sequence and onto the semiconductor material with the first doping in the first area of the LCI laser arrangement, the unmasked part of the layer sequence may be at least partially thinned or removed, and the semiconductor material with the second doping may be grown, e.g., by means of epitaxy, before the second lithographic etching mask 720 is again removed. Thus, the laser strip 340 of the LCI arrangement is defined. For further explanations, reference is made to FIG. 7 (6) on the right, i.e. the case in that the intermediate layer is exposed, prior to growing the area of the second doping.

Optionally (not shown in FIG. 7), depositing the first and/or second etching mask may further include depositing a material layer on at least a part of the layer sequence. Then, the etching masks 710, or 720, may be deposited onto at least a part of the material layer by means of a lithographic method. For example, partial removal of a material layer outside of the at least one part of the material layer may be carried out with an etching step for stripping away the intermediate layer.

Again in other words: In the steps of FIG. 7 (3) and (6) on the left side, the layer sequence (410) may be thinned in a first and/or second area of the layer sequence (410). Subsequently, the respective doped semiconductor material may be grown in this first/second area.

Alternatively (FIG. 7 (3) and (6) on the right side), the layer sequence may be removed in the first and second areas of the layer sequence (410) or even entirely so that the intermediate layer 320 is exposed. In other words, a first and second area of the intermediate layer 320 may be exposed. Epitaxially growing the respective doped semiconductor material may then be carried out on a first and second exposed area of the intermediate layer 320, which in turn corresponds to growing the semiconductor material in the first and second area of the layer sequence that was removed, or thinned.

The doped semiconductor areas 330, 335 forms the first and second area, respectively, of the LCI laser arrangement. The first/second area of the LCI laser arrangement then spatially corresponds to the first/second area of the layer sequence 410 that was thinned, for example.

Optionally, removing or thinning a part of the layer sequence, as is exemplarily shown in FIG. 7 (3) and (6), may include a selective dry etching method.

As a further optional feature of an inventive manufacturing method, as is shown in FIG. 7 (8), a passivation layer 390 may be deposited onto the LCI laser arrangement.

For example, at the end of step (b) or at the beginning of step (c), as is shown in FIG. 7 (9), contactings 400, 405 for the first and the second area 330, 335 of the LCI laser arrangement may subsequently take place. To this end, for example, a part of the passivation layer 390 may be removed, and the contacting may be deposited or arranged in the removed areas. To this end, for example, lithographic maskings or etching masks and an etching process may be used.

For example, the cavity may be generated in the following. The cavity is generated in the intermediate layer 320 at least under the laser strip 340 of the LCI laser arrangement. To this end, as is shown in FIG. 7 (10)-(11), a tunnel structure 380 may first be generated. As explained above, the tunnel structure 380 may be generated in the first and/or in the second area of the LCI laser arrangement so that it extends from the surface, opposite the intermediate layer 320, of the LCI laser arrangement to the intermediate layer 320 so as to at least partially expose the intermediate layer 320.

As an example, to this end, as is shown in FIG. 7 (10), a third etching mask (lithographic mask) 730 may be deposited or arranged on the LCI laser arrangement by means of a lithographic method. For example, the at least one tunnel structure 380 may be generated in the unmasked area of the LCI laser arrangement with the help of an etching method such as a dry etching method, cf. e.g. FIG. 7 (11).

Subsequently, the tunnel structure 380 may be used to generate the cavity 350 (cf. FIG. 7 (12)) in the intermediate layer 320. To this end, a selective etching solution may be introduced into the tunnel structure 380 so that the etching solution etches away the intermediate layer at least in an area underneath the layer strip 340. Furthermore, the lithographic mask may again be removed.

As already described with respect to the first and second lithographic mask 710, 720, a material layer for the third mask 730 may first be deposited on a part of the LCI laser arrangement or on a part of the passivation layer and the first and second contactings as well so that a third etching mask may subsequently be generated on at least a part of the material layer by means of a lithographic method. The following etching step, e.g., to generate the tunnel structure 380, then includes partially removing the material layer outside of the at least one part of the material layer, for example.

With the help of the tunnel structure 380, the cavity 350 may further be filled with a liquid filler. Subsequently, the filler may harden or be cured (not shown in FIG. 7).

Figure 8:
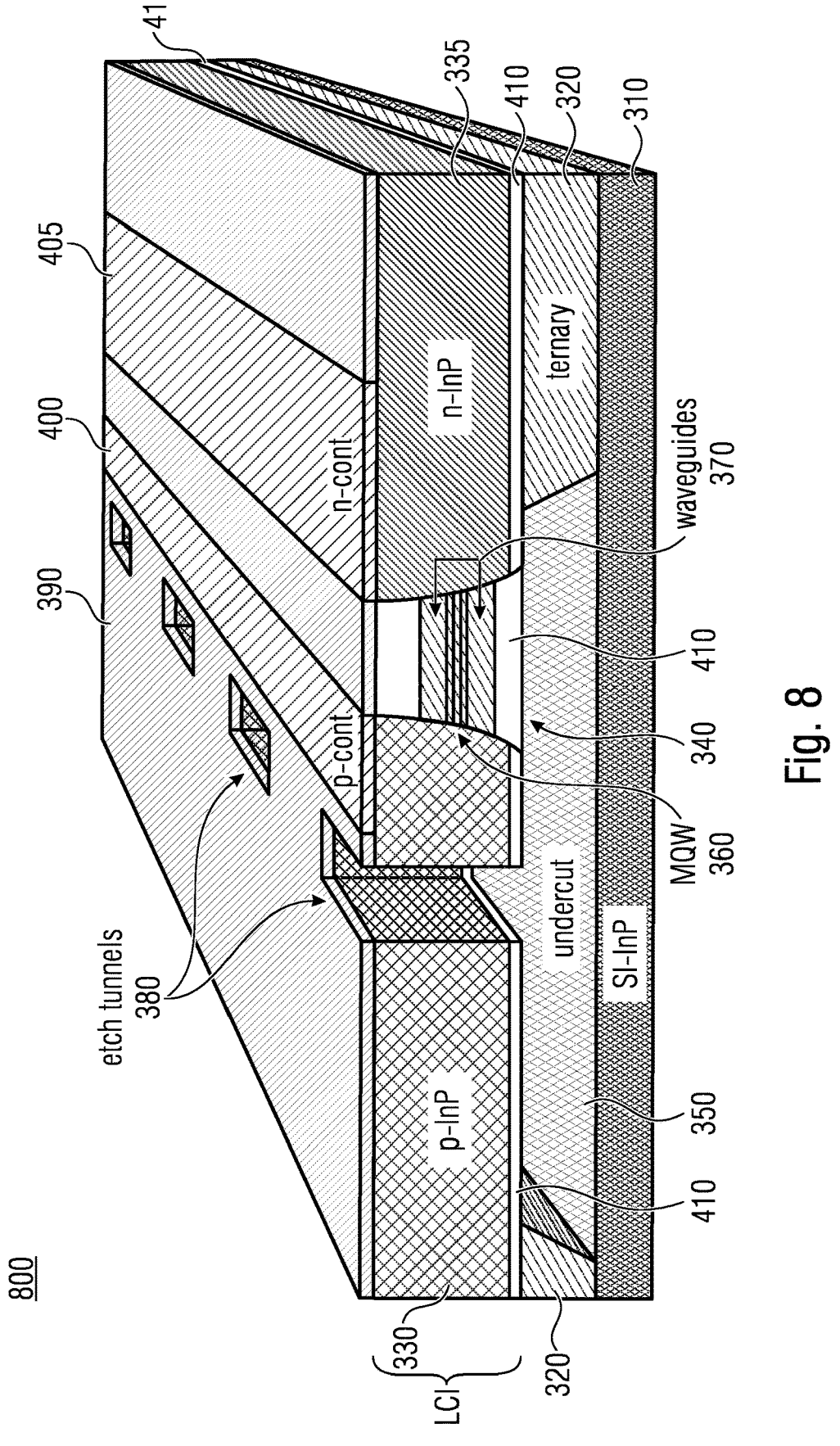
FIG. 8 shows a schematic side view of an alternative implementation of the apparatus of FIG. 3, wherein the layer sequence was only partially removed, according to embodiments of the present invention.

FIG. 8 shows a schematic side view of an alternative embodiment of the apparatus of FIG. 3, wherein the layer sequence has only been partially removed, according to embodiments of the present invention. FIG. 8 shows the apparatus 800 having already previously described features. According to the variations, shown in FIG. 7 (3) and (6) on the left, of removing the layer sequence 410, the apparatus 800 may still comprise corresponding portions of the layer sequence 410 underneath the doped semiconductor n-InP and p-InP, in contrast to the apparatus 300. For example, through temporally shortened etching steps, an inventive apparatus 800 may be generated with a reduced time effort.

In contrast to all solutions known to date, concepts according to the invention enable new methods for manufacturing LCI laser chips with a locally undercut membrane structure (e.g., the LCI laser arrangement), e.g., that for the first time also enable the monolithic integration with other optical and electrical components on an InP substrate. For example, such a membrane structure is used to significantly increase the optical confinement in the active layers, or in other words, to enable a good optical boundary of the generated laser radiation in the layer strip of the LCI laser arrangement, and through this, to achieve very small laser threshold currents and, associated therewith, a very small energy consumption of the lasers. By using semi-insulating waveguide layers above and below the active layers, small leakage currents may be achieved in such structures. As an example for such an inventive apparatus, reference is again made to FIG. 3.

As previously explained, the membrane structure according to the invention may be realized by a selectively etchable sacrificial layer (e.g. intermediate layer) being located underneath the laser strip, said layer being chemically removed during the laser manufacturing process. Through this, the LCI laser, or the LCI laser arrangement, remains on the InP substrate and may be monolithically integrated with other optical components.

For example, further advantageous of the concept according to the invention, e.g. with respect to known solutions from the conventional technology, are formed by:

According to embodiments, the sacrificial layer to be removed is optionally located directly underneath the laser structure and configures the same into a membrane laser. Thus, for example, the sacrificial layer is located at a very small distance to the laser structure and changes the laser structure itself, e.g., in contrast to previous approaches.

An advantage, e.g. or the purpose, of the cavity shaped according to the invention is the increase of the optical confinement by a tightening of the laser mode. In other words, the laser mode is optically affected or improved by the cavity.

In the following, details regarding examples of manufacturing methods according to the invention are again summarized in other words: First, the laser structure, e.g. the LCI laser arrangement, may be realized on the intermediate layer, e.g. a sacrificial layer (ternary layer, InGaAs). For example, it consists of a multi-quantum well (MQW) package with waveguide layers located above and below, and laterally adjacent p- and n-doped InP areas.

By means of a selective dry etching method, tunnel structures, or tunnels, may be etched in one of the doped areas, e.g., so as to expose the intermediate layer, or sacrificial layer. Starting from these tunnel structures, or simply put: openings, e.g., the intermediate layer (e.g. ternary sacrificial layer in FIG. 3) may subsequently be partially removed with a selectively etching solution so that a cavity is formed underneath the MQW and waveguide package. The width of this cavity may be determined by the etching time.

In the final laser chip, this cavity may prevent a vertical expansion of the optical mode through its low refractive index, e.g., by means of a gas as a filler (air: n=1), or through another low-refractive filling material, and may therefore significantly increase the optical confinement in the MQW layers. Through this, the efficiency of the layer may be significantly increased.

In general, manufacturing methods according to the invention may include the following process steps to manufacture an undercut membrane laser:

1. Epitaxy

Epitaxial growing of at least the following layers on a wafer (substrate):

Selectively etchable sacrificial layer (intermediate layer). This layer may be, or has to be, stripped away with an etching solution, whereas the n-conductive and p-conductive areas grown later CANNOT be stripped away. For example, InGaAs (indium gallium arsenide) that may be stripped away with sulfuric acid, not InP.

Layer package, composed of layers with different bandgaps, later functioning as an active medium and waveguide. For example, the sequence of:

Buffer made of InP

Waveguide made of InGaAsP (indium gallium arsenide phosphide)

Alternately, several quantum wells and barriers made of InGaAsP

Waveguide made of InGaAsP

Buffer made of InP

2. Manufacturing the lateral laser structure: N-conductor, active laser strip, P-conductor. Here, e.g., by means of the following process sequence:

lithographic masking of the laser strip and a laterally adjacent area stripping away the unmasked area, e.g., by means of selective dry etching.

epitaxially growing one of the areas n-InP or p-InP.

removing the masking and lithographic deposition of a new mask covering the laser strip and the area directly adjacent on the other side.

stripping away the unmasked area, e.g., by means of selective dry etching.

epitaxially growing the other one of the areas n-InP or p-InP.

3. Manufacturing contacts

Manufacturing one metal contact each on the n-conductive and p-conductive area laterally along the laser strip, e.g., by means of sputtering and electroplating.

4. Undercutting the laser strip

Here, e.g., by means of the following process sequence:

Manufacturing an access (tunnel structure) for the selective etching solution to the sacrificial layer (one or several perpendicular tunnels located laterally next to the laser strip) by means of lithographic masking of the surface and subsequent selective dry etching.

Dipping into the selected etching solution for an amount of time that is sufficient to fully strip away the sacrificial layer underneath the laser strip.

In particular, e.g., steps 3 and 4 may also be performed in a reverse order.

Further effects and advantages of concepts according to the invention include the possibility to monolithically integrate an LCI laser with a membrane structure with other optical components on an InP substrate, e.g., to monolithically integrate an apparatus for generating laser radiation according to embodiments with PICs on the InP substrates. In other words, this may be made possible by using the new manufacturing method according to the invention. For example, embodiments address or fulfil the object of realizing for the first time a floating LCI membrane structure on InP that may be directly monolithically integrated with passive waveguides, couplers, etc. Previously demonstrated LCI membrane structure production by means of a full removal of the InP substrate and subsequent wafer bonding on another substrate [4] [5] [6] (e.g., Si or SiNx) may here be fully omitted.

Thus, concepts according to embodiments enable improvements and new applications in a plurality of technical fields:

Due to their low operation power, LCI lasers according to the invention are in particular interesting for PICs with high integration density, e.g., in neuromorphic photonics, in quantum technology or in optical data networks. For example, in contrast to the previously known VCSEL arrays (7), arrays based on the LCI approach according to the invention enable different emission wavelengths per laser, e.g., at the same current, and may therefore also be used as multi-wavelength arrays for wavelength-division multiplexing (WDM) applications.

In addition, the floating laser structure according to the invention makes it possible to monolithically integrate such LCI lasers with other active and passive optical components on InP wafers. LCI lasers may therefore significantly add to current InP-based integration platforms with respect to PICs with high integration density and may therefore enable completely new highly-integrated applications that may not be realized with conventional edge-emitting lasers due to the excessive introduction of heat.

All lists of materials, environmental influences, electrical properties, and optical properties mentioned herein are considered to be exemplary and not exclusive.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed by a hardware device (or using a hardware device). In some embodiments, some or several of the most important method steps may be performed by such a device.

The above-described embodiments merely represent an illustration of the principles of the present invention. It is understood that other persons skilled in the art will appreciate modifications and variations of the arrangements and details described herein. This is why it is intended that the invention be limited only by the scope of the following claims rather than by the specific details that have been presented herein by means of the description and the discussion of the embodiments.

REFERENCES

[1] Y. Shen, N. C. Harris, S. Skirlo, M. Prabhu, T. Baehr-Jones, M. Hochberg, X. Sun, S. Zhao, H. Larochelle, D. Englund und others, "Deep learning with coherent nanophotonic circuits," Nature Photonics, edition 11, p. 441, 2017.

[2] L. De Marinis, M. Cococcioni, P. Castoldi und N. Andriolli, "Photonic neural networks: a survey," IEEE Access, edition 7, pp. 175827-175841, 2019.

[3] T. Hiratani, K. Doi, Y. Atsuji, T. Amemiya, N. Nishiyama und S. Arai, "Low-power and high-speed operation capabilities of semiconductor membrane lasers— Energy cost limited by Joule heat," in 26th International Conference on Indium Phosphide and Related Materials (IPRM), 2014.

[4] S. Matsuo, T. Fujii, K. Hasebe, K. Takeda, T. Sato und T. Kakitsuka, "Ultralow operating energy of directly modulated DFB laser on SiO2/Si substrate," in Optical Communication (ECOC), 2014 European Conference on, 2014.

[5] N.-P. P. Diamantopoulos, S. Yamaoka, T. Fujii, H. Nishi, K. Takeda, T. Tsuchizawa, T. Kakitsuka und S. Matsuo, "47.5 GHz Membrane-III-V-on-Si Directly Modulated Laser for Sub-pJ/bit 100-Gbps Transmission," in Photonics, 2021.

[6] D. Inoue, T. Hiratani, K. Fukuda, T. Tomiyasu, T. Amemiya, N. Nishiyama und S. Arai, "Low-bias current 10 Gbit/s direct modulation of GaInAsP/InP membrane DFB laser on silicon," Optics express, edition 24, pp. 18571-18579, 2016.

[7] W. Hofmann, E. Wong, G. Bohm, M. Ortsiefer, N. H. Zhu und M. C. Amann, "1.55-mu m VCSEL Arrays for High-Bandwidth WDM-PONs," IEEE Photonics Technology Letters, edition 20, pp. 291-293, 2008.

[8] "DBR laser with improved thermal tuning efficiency". U.S. Pat. No. 8,236,590 B2, 2012.

[9] N.-P. Diamantopoulos, H. Yamazaki, S. Yamaoka, M. Nagatani, H. Nishi, H. Tanobe, R. Nakao, T. Fujii, K. Takeda, T. Kakitsuka und others, ">100-GHz Bandwidth Directly-Modulated Lasers and Adaptive Entropy Loading for Energy-Efficient>300-Gbps/λ IM/DD Systems," Journal of Lightwave Technology, edition 39, pp. 771-778, 2021.

The invention claimed is:

1. An apparatus for generating laser radiation, comprising:
a semiconductor substrate,
an intermediate layer arranged on the semiconductor substrate; and
a Lateral Current Injection (LCI) laser arrangement arranged on the intermediate layer,
wherein the intermediate layer comprises a cavity extending at least under a laser strip of the LCI laser arrangement;
wherein the LCI laser arrangement comprises a first area with a first doping, and
wherein the LCI laser arrangement comprises a second area with a second doping,
wherein the first and the second doping are different; and
wherein the laser strip of the LCI laser arrangement is arranged laterally between the first area and the second area of the LCI laser arrangement, and
wherein the laser strip is configured to generate the laser radiation on the basis of a current that is laterally fed in by means of the first and second areas; and
wherein the LCI laser arrangement comprises at least one tunnel structure,
wherein the at least one tunnel structure is arranged in the first and/or the second area of the LCI laser arrangement; and
wherein the at least one tunnel structure extends from the cavity in the intermediate layer up to the surface, opposite the intermediate layer, of the LCI laser arrangement;
wherein the apparatus comprises a first contacting and a second contacting,
wherein the first contacting is arranged on the first area of the LCI laser arrangement, and
wherein the first contacting is configured to enable an electrical contact to the first area of the LCI laser arrangement, and
wherein the second contacting is arranged on the second area of the LCI laser arrangement, and
wherein the second contacting is configured to enable an electrical contact to the second area of the LCI laser arrangement; and
wherein the first contacting is arranged laterally between the tunnel structure and the laser strip of the LCI laser arrangement; and/or
wherein the second contacting is arranged laterally between the tunnel structure and the laser strip of the LCI laser arrangement.

2. The apparatus according to claim 1, wherein the intermediate layer is arranged directly on the substrate.

3. The apparatus according to claim 1,
wherein the cavity is configured to optically confine the laser radiation in the laser strip of the LCI laser arrangement.

4. The apparatus according to claim 1,
wherein the apparatus comprises a passivation layer, and
wherein the passivation layer is at least arranged partially on the surface, opposite the intermediate layer, of LCI laser arrangement.

5. The apparatus according to claim 1,
wherein the apparatus comprises a contacting layer,
wherein the contacting layer comprises a doped semiconductor material, and
wherein the contacting layer is arranged on the surface, opposite the intermediate layer, of the substrate; and
wherein the contacting layer comprises a third contacting,
wherein the third contacting is configured to enable an electrical contact to the contacting layer; and
wherein the first contacting extends from the first area of the LCI laser arrangement to the contacting layer; and
wherein the third contacting is electrically connected to the first contacting via the doped semiconductor material; or
wherein the second contacting extends from the second area of the LCI laser arrangement to the contacting layer, and
wherein the third contacting is electrically connected to the second contacting via the doped semiconductor material.

6. The apparatus according to claim 1,
wherein the laser strip of the LCI laser arrangement comprises at least one multi-quantum well package; and
wherein the laser strip of the LCI laser arrangement comprises waveguide layers; and
wherein the waveguide layers are semi-insulating waveguide layers, and wherein the semi-insulated waveguide layers are arranged vertically above and below the at least one multi-quantum well package.

7. The apparatus according to claim 1, wherein the cavity and/or the at least one tunnel structure comprises a filler; and
wherein the filler is configured to optically confine the laser radiation and the laser strip of the LCI laser arrangement.

8. The apparatus according to claim 1,
wherein the substrate comprises indium phosphide; and/or
wherein the first and the second area of the LCI laser arrangement comprise indium phosphide; and/or
wherein the laser strip of the LCI laser arrangement comprises indium gallium arsenide phosphide; and/or
wherein the apparatus comprises a passivation layer, the passivation layer comprising silicon nitride; and/or
wherein the apparatus comprises a contacting layer, the contacting layer comprising indium phosphide with the first or the second doping.

9. The apparatus according to claim 1,
wherein the apparatus comprises an optical component, and wherein the optical component and the LCI laser arrangement are monolithically integrated on the substrate; and
wherein the optical component is a photonic integrated circuit; and
wherein the LCI laser arrangement is optically coupled to the photonic integrated circuit; and
wherein the LCI laser arrangement is configured to provide the laser radiation for the photonic integrated circuit.

* * * * *